(12) United States Patent
Eda

(10) Patent No.: US 7,094,687 B1
(45) Date of Patent: Aug. 22, 2006

(54) REDUCED DRY ETCHING LAG

(75) Inventor: Masaichi Eda, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/071,903

(22) Filed: Mar. 2, 2005

(51) Int. Cl.
*H01L 21/4763* (2006.01)

(52) U.S. Cl. ............... 438/637; 438/672; 438/675; 257/E21.575; 257/E21.59; 257/E21.627

(58) Field of Classification Search .............. 438/618, 438/637, 672, 675, FOR. 355, FOR. 489; 257/E21.575, E21.59, E21.627
See application file for complete search history.

(56) References Cited

U.S. PATENT DOCUMENTS

| | | | | |
|---|---|---|---|---|
| 5,904,563 | A * | 5/1999 | Yu | 438/672 |
| 6,093,629 | A * | 7/2000 | Chen | 438/597 |
| 6,165,880 | A * | 12/2000 | Yaung et al. | 438/592 |
| 2002/0185671 | A1* | 12/2002 | Kim | 257/301 |
| 2004/0127013 | A1* | 7/2004 | Wu et al. | 438/618 |
| 2005/0191850 | A1* | 9/2005 | Soda | 438/633 |

* cited by examiner

Primary Examiner—Michelle Estrada

(74) Attorney, Agent, or Firm—Luedeka, Neely & Graham, P.C.

(57) ABSTRACT

A method of forming via structures between a first electrically conductive layer and a second electrically conductive layer. The first electrically conductive layer is formed, and a dielectric layer is formed over the first electrically conductive layer. A first photoresist layer is formed over the dielectric layer, and patterned with a first via hole pattern. The first via hole pattern includes via holes that are all disposed within a first distance one from another, called dense via holes, and excludes via holes that are disposed at greater than the first distance one from another, called isolated via holes. The dense via holes are etched into the dielectric layer at first etch conditions until the dense via holes are properly formed, and the first photoresist layer is removed. A second photoresist layer is formed over the dielectric layer, and is patterned with a second via hole pattern. The second via hole pattern excludes dense via holes and includes isolated via holes. The isolated via holes are etched into the dielectric layer at second etch conditions until the isolated via holes are properly formed, and the second photoresist layer is removed. Electrically conductive vias are formed within both the dense via holes and the isolated via holes, and the second electrically conductive layer is formed over the dielectric layer. Electrical continuity exists between the first electrically conductive layer and the second electrically conductive layer through the electrically conductive vias.

17 Claims, 2 Drawing Sheets

REDUCED DRY ETCHING LAG

FIELD

This invention relates to the field of integrated circuit fabrication. More particularly, this invention relates to etching the layers, most specifically silicon dioxide layers, of which integrated circuits are formed.

BACKGROUND

Integrated circuits are fabricated by forming a layer, performing some type of processing in regard to that formed layer—such as etching—and then forming an overlying layer. This process is repeated many times until the completed integrated circuit is formed.

As the term is used herein, "integrated circuit" includes devices such as those formed on monolithic semiconducting substrates, such as those formed of group IV materials like silicon or germanium, or group III–V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

One layer type that is commonly used is a dielectric or electrically insulating layer between two electrically conductive layers, such as metal layers. An oxide of some type, most commonly silicon dioxide, is often used to form the dielectric layer. These dielectric layers are used to electrically insulate the adjacent electrically conductive layers one from another. However, it is typically desirable to form a pattern of via holes through the dielectric layer after it is formed, and fill the via holes with an electrically conducting material, such as metal, so that selective electrical connections can be made between the overlying and underlying conductive layers, through the dielectric layers.

Such via holes are typically formed by an etching process of some type. A layer of photoresist is applied to the dielectric layer, and exposed and developed to produce a via hole pattern in the photoresist. The substrate is then subjected to a wet or dry etch, such as a physical ion or reactive ion etching process. The photoresist protects the dielectric layer from etching in those areas where the photoresist layer remains, but where the photoresist layer has been developed away, the dielectric layer etches in the via hole pattern.

Etching preferably continues until all of the via holes in the pattern have been etched to the desired depth. Unfortunately, for a variety of reasons, some of the via holes tend to etch at a different rate than others of the via holes. For example, those via holes that are grouped together in a relatively dense pattern of via holes tend to etch at a rate that is somewhat greater than those via holes that are in a relatively isolated pattern. If the dielectric layer is allowed to etch for a length of time that is sufficient to completely etch the relatively isolated via holes, then the relatively dense via holes tend to be over etched. Conversely, if the dielectric layer is etched for a length of time that is only sufficient to completely etch the relatively dense via holes, then the relatively isolated via holes tend to be under etched. In either case, the operation of the integrated circuit tends to be compromised.

Various etching parameters can be adjusted in order to reduce the difference in etch rate between the relatively dense via holes and the relatively isolated via holes. This difference is sometimes referred to a lag in the etch rate of the relatively isolated via holes. For example, the kind of gas that is used for the dry etching, the gas flow rates, the chamber pressure, the substrate temperature, and the processing power can all be adjusted in order to try to reduce the etch lag. However, these parameters all tend to also effect other characteristics of the etch process, such as the etch rate, etch selectively, and etch profiles, one or more of which may be deleterious to the process.

What is needed, therefore, is a method of etching relatively dense via holes and relatively isolated via holes in a manner that generally reduces problems such as those described above, at least in part.

SUMMARY

The above and other needs are met by a method of forming via structures between a first electrically conductive layer and a second electrically conductive layer. The first electrically conductive layer is formed, and a dielectric layer is formed over the first electrically conductive layer. A first photoresist layer is formed over the dielectric layer, and patterned with a first via hole pattern. The first via hole pattern includes via holes that are all disposed within a first distance one from another, called dense via holes, and excludes via holes that are disposed at greater than the first distance one from another, called isolated via holes. The dense via holes are etched into the dielectric layer at first etch conditions until the dense via holes are properly formed, and the first photoresist layer is removed.

A second photoresist layer is formed over the dielectric layer, and is patterned with a second via hole pattern. The second via hole pattern excludes dense via holes and includes isolated via holes. The isolated via holes are etched into the dielectric layer at second etch conditions until the isolated via holes are properly formed, and the second photoresist layer is removed. Electrically conductive vias are formed within both the dense via holes and the isolated via holes, and the second electrically conductive layer is formed over the dielectric layer. Electrical continuity exists between the first electrically conductive layer and the second electrically conductive layer through the electrically conductive vias.

By separating the etch processes for the dense via holes and the isolated via holes in this manner, the etch conditions can be adjusted as necessary so that both the dense via holes and the isolated are properly formed. In addition, adjustment of etch conditions that would adversely effect other etch parameters can be avoided in both of the etch processes. For example, in one embodiment, only the length of time is varied between the two etch processes. Although the method requires an additional masking step, the improvement in the etch of the via holes tends to make the additional processing worthwhile. In some embodiments, more than two mask levels are used to etch all of the vias, by dividing the via holes into more than two groups, such as a dense group, an intermediate group, and an isolated group. Any number of groups, all preferably based on via hole density, could be used, as desired. The various groups could be etched in any order desired, and the most dense group need not be etched prior to the other group or groups.

In various embodiments, the first etch conditions are different from the second etch conditions. In some embodiments, the dense via holes and the isolated via holes all have a diameter of no more than about two hundred nanometers. In different embodiments, the etches are one or more of a reactive ion etch, a physical etch, and a wet etch.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
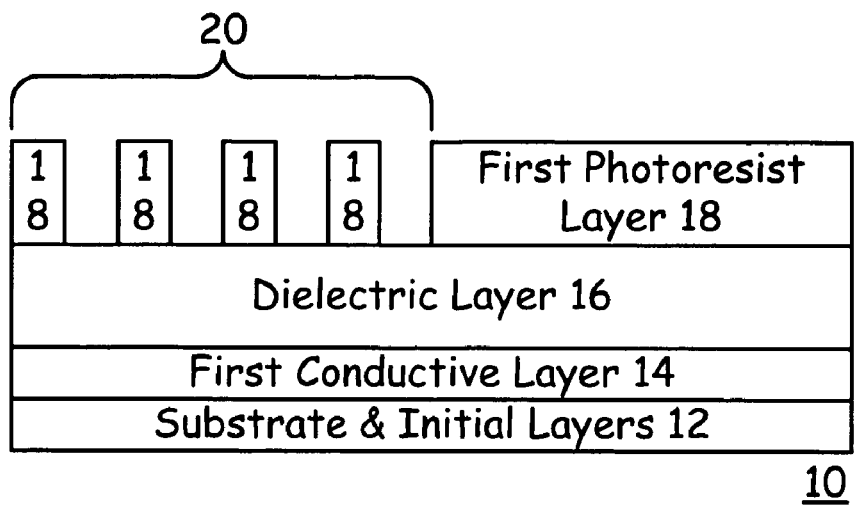
FIG. 1 is a cross sectional view of a portion of an integrated circuit depicting a substrate, a lower electrically conductive layer, a dielectric layer in which via holes are to be formed, and a first photoresist layer patterned with a first via hole pattern for dense via holes.
Figure 2:
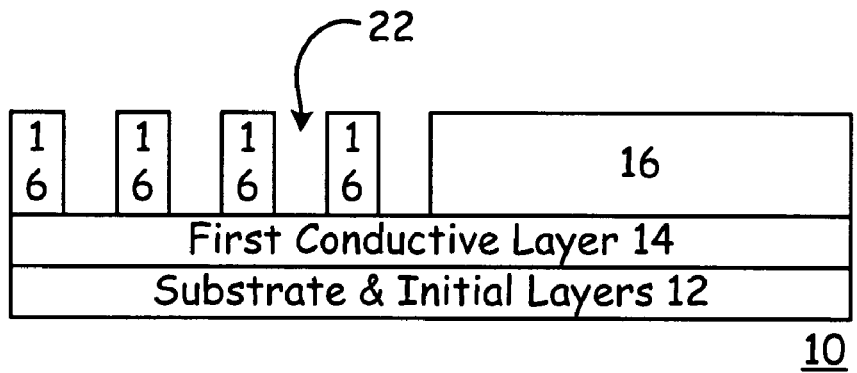
FIG. 2 is a cross sectional view of the integrated circuit of FIG. 1, where the dense via holes have been etched and the first photoresist layer has been removed.

With reference now to FIG. 1, there is depicted a cross sectional view of a portion of an integrated circuit 10 with a substrate 12, a lower electrically conductive layer 14, a dielectric layer 16 in which via holes are to be formed, and a first photoresist layer 18 patterned with a first via hole pattern 20 for dense via holes 22.

The substrate 12 as depicted may include additional initial layers, which are not individually depicted so as to not unnecessarily encumber the drawings. Most preferably, the substrate 12 is a silicon substrate having active circuitry formed therein and various structures as are known in the art formed thereon. The first conductive layer 14 is an electrically conductive layer, and is preferably formed of a metal, and most preferably of a series of metal and metallic layers. Although the layer 14 is referred to herein as the first conductive layer, it is appreciated that it may not be the first conductive layer that is disposed on the substrate 12, but is only referred to as the first conductive layer so as to distinguish it from subsequent conductive layers that are described herein.

The dielectric layer 16 is a non electrically conductive layer, and may be formed of any suitable material. In the preferred embodiments the dielectric layer 16 is formed of an oxide, and is most preferably formed of silicon dioxide. The dielectric layer 16 resides directly atop the first conductive layer 14. Similar to that as described above in regard to the first conductive layer 14, the dielectric layer 16 may be a series of non electrically conductive layers, which are collectively referred to herein as the dielectric layer 16.

A first layer of photoresist 18 is deposited and patterned on top of the dielectric layer 16. The first photoresist layer 18 is, in the embodiment depicted, patterned with a relatively dense via hole pattern 20. The photoresist layer 18 is not patterned with any via holes that would be considered relatively isolated. The exact determination of what makes a set of via holes either dense or isolated is based on a variety of factors such as the diameter of the via holes, the thickness of the photoresist, the thickness of the dielectric layer 16, the depth of the via holes, the aspect ratio of the via holes, and other parameters. Thus, such a bright line distinction cannot be made in this description where the general case is put forth. Rather, such a distinction is left to the actual, individual applications, based on the criteria as generally described herein. However, as a rule, the distinction can be made based on the existence of problems such as those described in the background section of this document. Thus, sets of via holes can be binned into groups based upon empirical evidence as to which sets do not etch at the same rate.

The dense via holes 22 are then etched into the dielectric layer 16. The dense via holes 22 are etched completely through the dielectric layer 16 in this embodiment, which as described above, may include a series of different layers. In other embodiments, the dense via holes 22 are etched down to an etch stop layer, which may or may not be the first conductive layer 14. In various embodiments, a wet etch or some type of dry etch may be used. The dry etch may be either a physical etch, such as a sputter etch or an ion mill, or a chemically reactive ion etch. The first photoresist layer 18 is removed after the etch has been accomplished.

Figure 3:
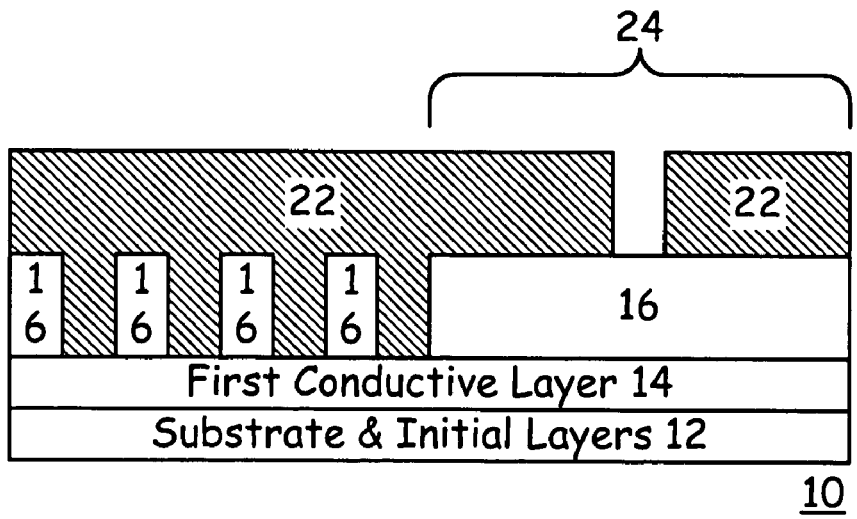
FIG. 3 is a cross sectional view of the integrated circuit of FIG. 2, where a second photoresist layer has been applied and patterned with a second via hole pattern for isolated via holes.

As depicted in FIG. 3, a second photoresist layer 22 is applied and patterned with only the isolated via hole pattern 24. It is appreciated that the order of the two mask patterns 20 and 24 are by way of example only, and that in actual implementation, there may be reasons why the isolated via hole pattern 24 is applied and etched first, instead of applying and etching the dense via hole pattern 20 as described herein. In other cases there may be no real reason to perform the etches in a specific order.

Figure 4:
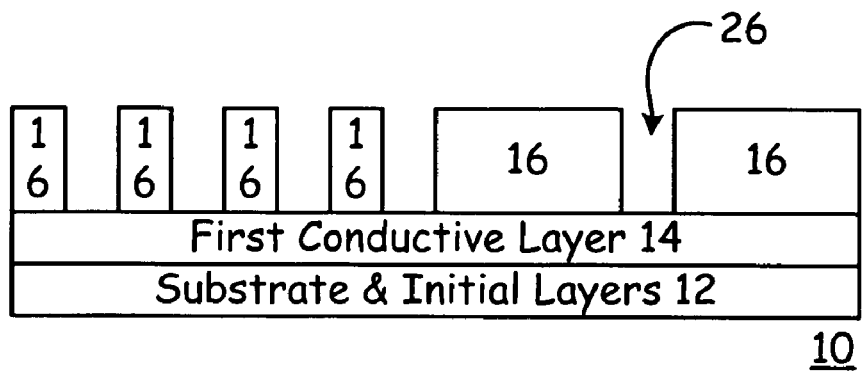
FIG. 4 is a cross sectional view of the integrated circuit of FIG. 3, where the isolated via holes have been etched and the second photoresist layer has been removed.

As depicted in FIG. 4, the isolated via hole pattern 24 is then etched to produce the isolated via holes 26. The parameters for the first and second etch processes could be either the same or different for the two sets of via hole patterns 20 and 24, but in most cases would be different, or else there would tend to be little reason to separate the two processes. However, the etch processes may be different by as seemingly small a factor as the length of time which they are allowed to continue. Although that may be a relatively small distinction between the two processes, such a processing difference can make a tremendous difference in properly forming the two different types of via holes.

Figure 5:
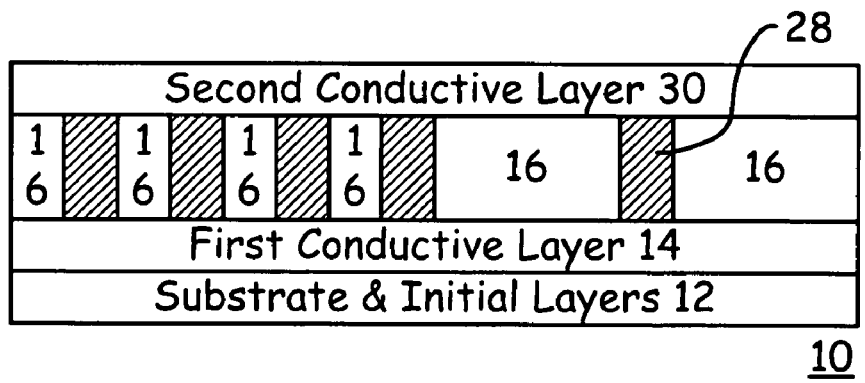
FIG. 5 is a cross sectional view of the integrated circuit of FIG. 4, where the via holes have been filled and an upper electrically conductive layer has been formed.

After etching the second set of via holes, which in this example is the set of isolated via holes 26, all of the via holes are filled with an electrically conductive material 28 so as to form electrical connections with the first conductive layer 14, as depicted in FIG. 5. If a non conductive etch stop layer is used to stop both of the etch processes, and the etch stop layer is not removed during the individual etch processes described above, then that etch stop layer is preferably removed from all of the via holes prior to filling them with the electrically conductive material 28.

As introduced above, it may be desirable to bin the via holes into more than just two groups, if differences in via hole density tend to vary sufficiently that even two different processing conditions do not remedy the problems describe above.

Finally, the second conductive layer 30 is preferably formed directly on top of the dielectric layer 16. The second conductive layer 30 is preferably constructed in the various manners and with the same considerations as the first conductive layer 14, but adapted to provide the characteristics as desired in the second conductive layer 30. Thus, the first conductive layer 14 has electrical connection with the second conductive layer 30 by means of the conductive material 28 through the dielectric layer 16, without any intermediate structures. Following this step, traditional further processing of the integrated circuit 10 is preferably accomplished.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of forming via structures between a first electrically conductive layer and a second electrically conductive layer, the method comprising the sequential steps of:

forming the first electrically conductive layer, forming a dielectric layer over the first electrically conductive layer, forming a first photoresist layer over the dielectric layer, patterning the first photoresist layer with a first via hole pattern that includes via holes that are all disposed within a first distance one from another, called dense via holes, and excludes via holes that are disposed at greater than the first distance one from another, called isolated via holes, etching the dense via holes into the dielectric layer at first etch conditions until the dense via holes are properly formed, removing the first photoresist layer, forming a second photoresist layer over the dielectric layer, patterning the second photoresist layer with a second via hole pattern that excludes dense via holes, and includes isolated via holes, etching the isolated via holes into the dielectric layer at second etch conditions until the isolated via holes are properly formed, wherein the first etch conditions are different from the second etch conditions, removing the second photoresist layer, forming electrically conductive vias within both the dense via holes and the isolated via holes, and forming the second electrically conductive layer over the dielectric layer, where electrical continuity exists between the first electrically conductive layer and the second electrically conductive layer through the electrically conductive vias.

2. The method of claim 1, wherein the dense via holes and the isolated via holes all have a diameter of no more than about two hundred nanometers.

3. The method of claim 1, wherein the etch is a reactive ion etch.

4. The method of claim 1, wherein the etch is a physical etch.

5. The method of claim 1, wherein the etch is a wet etch.

6. A method of forming via structures between a first electrically conductive layer and a second electrically conductive layer, the method comprising the sequential steps of:

forming the first electrically conductive layer, forming a dielectric layer over the first electrically conductive layer, forming a first photoresist layer over the dielectric layer, patterning the first photoresist layer with a first via hole pattern that excludes via holes that are all disposed within a first distance one from another, called dense via holes, and includes via holes that are disposed at greater than the first distance one from another, called isolated via holes, etching the isolated via holes into the dielectric layer at first etch conditions until the isolated via holes are properly formed, removing the first photoresist layer, forming a second photoresist layer over the dielectric layer, patterning the second photoresist layer with a second via hole pattern that includes dense via holes, and excludes isolated via holes, etching the dense via holes into the dielectric layer at second etch conditions until the dense via holes are properly formed, wherein the first etch conditions are different from the second etch conditions, removing the second photoresist layer, forming electrically conductive vias within both the dense via holes and the isolated via holes, and forming the second electrically conductive layer over the dielectric layer, where electrical continuity exists between the first electrically conductive layer and the second electrically conductive layer through the electrically conductive vias.

7. The method of claim 6, wherein the dense via holes and the isolated via holes all have a diameter of no more than about two hundred nanometers.

8. The method of claim 6, wherein the etch is a reactive ion etch.

9. The method of claim 6, wherein the etch is a physical etch.

10. The method of claim 6, wherein the etch is a wet etch.

11. A method of forming via holes in a layer, the method comprising the steps of:

forming a first photoresist layer over the layer, patterning the first photoresist layer with a first via hole pattern that includes via holes that are all disposed within a first distance one from another, called dense via holes, and excludes via holes that are disposed at greater than the first distance one from another, called isolated via holes, etching the dense via holes into the layer at first etch conditions until the dense via holes are properly formed, removing the first photoresist layer, forming a second photoresist layer over the layer, patterning the second photoresist layer with a second via hole pattern that excludes dense via holes, and includes isolated via holes, etching the isolated via holes into the layer at second etch conditions until the isolated via holes are properly formed, wherein the first etch conditions are different from the second etch conditions, and removing the second photoresist layer.

12. The method of claim 11, wherein the dense via holes and the isolated via holes all have a diameter of no more than about two hundred nanometers.

13. The method of claim 11, wherein the etch is a reactive ion etch.

14. The method of claim 11, wherein the etch is a physical etch.

15. The method of claim 11, wherein the etch is a wet etch.

16. The method of claim 11, further comprising forming electrically conductive vias within both the dense via holes and the isolated via holes.

17. The method of claim 11, further comprising:
   forming a first electrically conductive layer immediately underlying the layer,
   forming a second electrically conductive layer immediately overlying the layer, and
   electrically connecting the first electrically conductive layer and the second electrically conductive layer with electrically conductive vias within both the dense via holes and the isolated via holes through the layer.

\* \* \* \* \*